Figure 1:
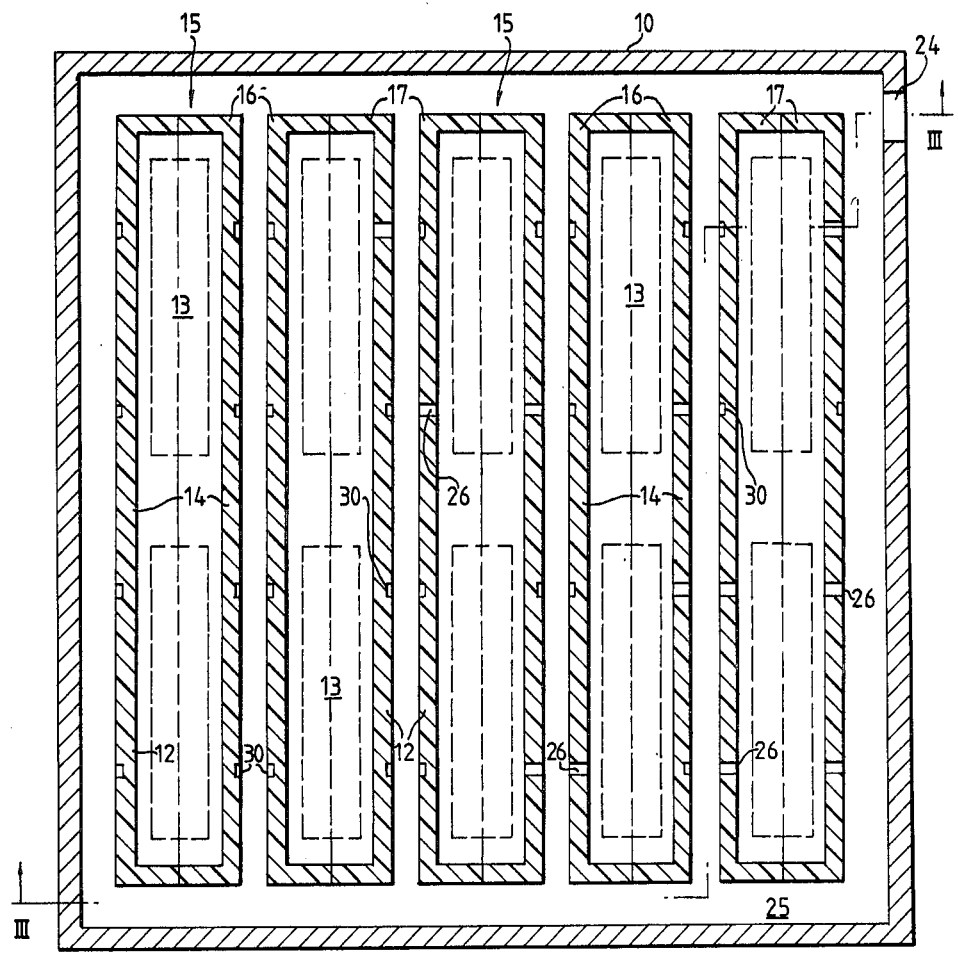

United States Patent [19]

Bell et al.

[11] 4,393,437
[45] Jul. 12, 1983

[54] COOLING MEANS FOR CIRCUIT ASSEMBLIES EACH INCLUDING HOLLOW STRUCTURES SPACED APART IN A CONTAINER

[75] Inventors: Melvyn R. Bell, Crossgates; Charles D. Thomson, Edinburgh, both of Scotland

[73] Assignee: Ferranti Limited, Cheadle, England

[21] Appl. No.: 284,095

[22] Filed: Jul. 16, 1981

Related U.S. Application Data

[63] Continuation of Ser. No. 92,454, Nov. 7, 1979, abandoned.

[30] Foreign Application Priority Data

Nov. 11, 1978 [GB] United Kingdom ............... 44145/78

[51] Int. Cl.³ ............................................. H05K 7/20
[52] U.S. Cl. ................................. 361/383; 165/80 B; 361/384; 361/395
[58] Field of Search .......................... 165/80 B, 80 D; 174/15 R, 16 R; 361/382, 383, 384, 385, 386, 395, 399

[56] References Cited

U.S. PATENT DOCUMENTS

| 3,646,400 | 2/1972 | Oemarest | 361/383 |
| 3,648,113 | 3/1972 | Rathyen | 361/383 |
| 3,940,665 | 2/1976 | Seki | 361/383 |
| 3,956,673 | 5/1976 | Seid | 361/382 |
| 4,126,269 | 11/1978 | Bruges | 361/384 |
| 4,158,875 | 6/1979 | Tajima | 361/384 |

FOREIGN PATENT DOCUMENTS

| 1035554 | 7/1966 | United Kingdom . |
| 1128939 | 10/1968 | United Kingdom . |
| 1312404 | 4/1973 | United Kingdom . |

*Primary Examiner*—G. P. Tolin
*Attorney, Agent, or Firm*—Kerkam, Stowell, Kondracki & Clarke

[57] ABSTRACT

A circuit assembly having a plurality of planar substrates 14 with modules and/or components 13 mounted thereon, has the substrates comprising at least parts of walls of substantially enclosed hollow structures 15, for example, the substrates comprising two opposing and parallel walls of each structure, the structures are mounted spaced apart within a container 10, and the arrangement is such that cooling fluid is to flow from a supply to the circuit assembly, and is to be discharged from the circuit assembly, the cooling fluid to flow between the regions within the container surrounding the structures and the interiors of at least some of the structures, via holes 26 in the walls of the structures, so that the cooling fluid can be supplied easily and efficiently to points within the circuit assembly where generated heat is required to be removed, the construction of the circuit assembly being flexible in this manner.

15 Claims, 5 Drawing Figures

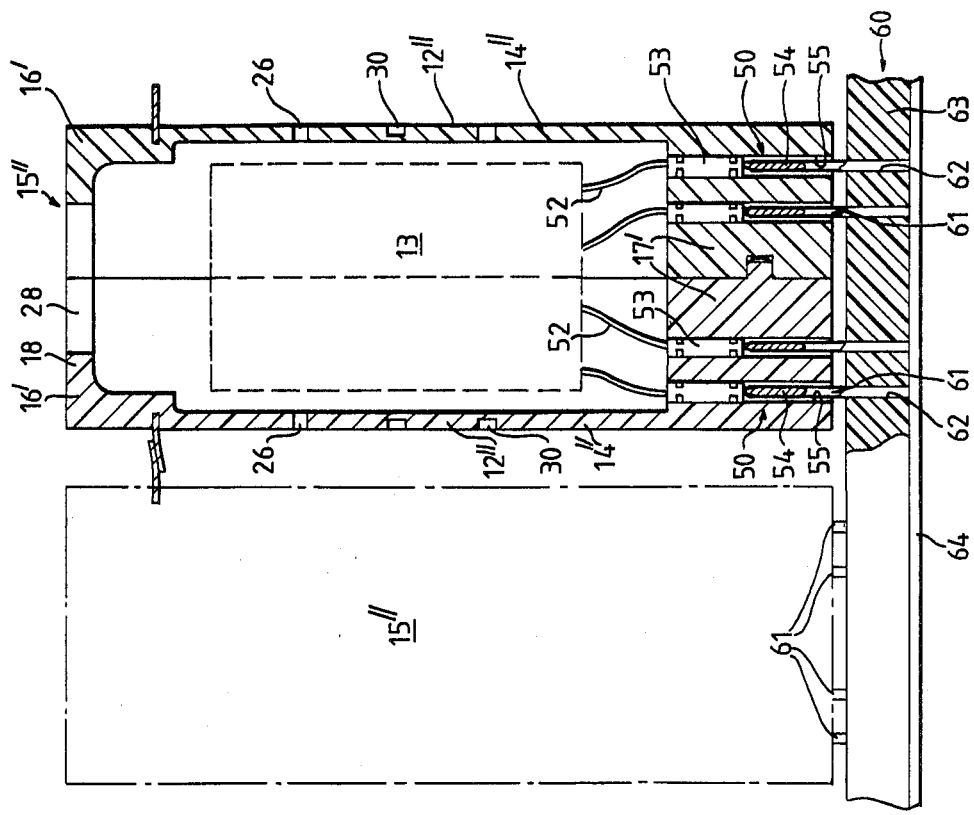
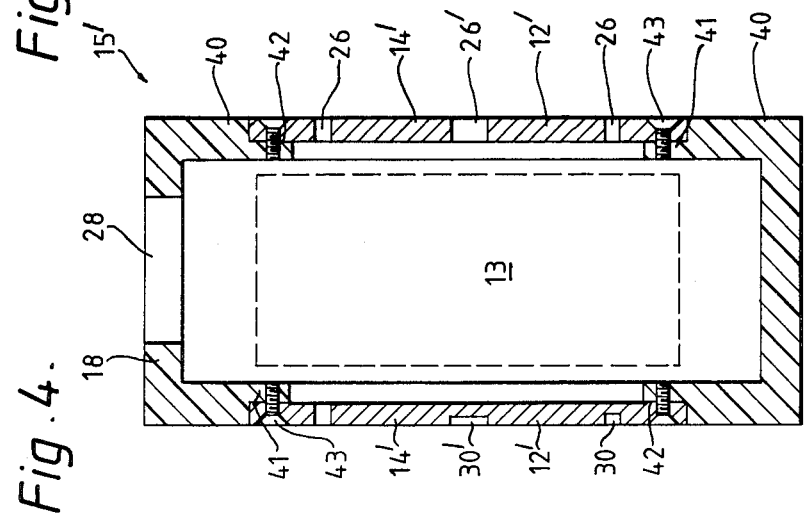
Fig. 5.
Fig. 4.

COOLING MEANS FOR CIRCUIT ASSEMBLIES EACH INCLUDING HOLLOW STRUCTURES SPACED APART IN A CONTAINER

This application is a continuation of application Ser. No. 092,454, filed Nov. 7, 1979, now abandoned.

CIRCUIT ASSEMBLIES

This invention relates to circuit assemblies, and in particular to circuit assemblies each having a plurality of sub-assembly units, each sub-assembly unit having a planar substrate, for example, such as a printed circuit board or heat sink, constituent electrical components, comprising discrete components, and/or modules, such as thin film modules, of the circuit assembly, being mounted on the substrates, and the plurality of sub-assembly units are electrically interconnected to complete the required circuit.

Terminals for the sub-assembly units may be provided in any convenient manner. The sub-assembly units may be interconnected to complete the required circuit in any convenient way, for example, by providing an electrical interconnection member, such as a mother printed circuit board, extending to co-operate with terminals provided at one edge of each constituent substrate, possibly the electrical interconnection member, at least partially, serving to secure the substrates within the circuit assembly.

In complex circuit assemblies, having densely packed modules and/or components, it is a problem to remove generated heat before such heat can cause damage to the circuit assemblies.

It is known to provide a supply of a cooling fluid, such as air, to a circuit assembly to remove generated heat, and it is an object of the present invention to provide a construction for such a circuit assembly in which cooling fluid can be supplied easily and efficiently to points within the circuit assembly where generated heat is required to be removed, the construction of the circuit assembly being flexible in this manner, such points within the circuit assembly, and the required distribution of the flow of cooling fluid within the circuit assembly, being determined when the circuit assembly is being designed and/or during development stages for the construction of the circuit assembly.

According to the present invention in a circuit assembly having a plurality of sub-assembly units, each sub-assembly unit having a planar substrate, with constituent modules and/or components of the circuit assembly being mounted on the substrates, and the plurality of sub-assembly units being connected together to complete the required circuit, the sub-assembly units are arranged each to comprise at least part of a wall of a substantially enclosed hollow structure, at least one substrate being included in each such structure, and the constituent structures are mounted spaced apart from each other within an at least substantially enclosed container to receive cooling fluid, of each structure one constituent wall, not including a substrate, serving to provide part of a closure for the container, holes for the flow of cooling fluid between the regions within the container surrounding the structures and the interiors of at least some of the structures being provided through the walls of the structures within the container, and passages for the flow of cooling fluid between the circuit assembly and external of the circuit assembly being provided, such passages being provided through the container-enclosing walls of the structures, to communicate with the interior of the structure, and at least one passage being provided to communicate with the regions within the container surrounding the structures.

Usually, if at least one hole is provided for the flow of cooling fluid between the regions within the container surrounding the structures and the interior of a structure, a passage is also provided for the flow of cooling fluid between the interior of the structure and external of the circuit assembly, and generally, such a hole and a passage are provided for each constituent structure of the circuit assembly.

The means to supply the cooling fluid may not be included in the circuit assembly. Generally, the regions within the container surrounding the hollow structures are in direct communication with each other. The interiors of the hollow structures may be in communication with each other.

In one arrangement, the regions within the container surrounding the hollow structures together comprise a chamber to receive cooling fluid, and the hollow structures comprise discharge ducts by which the cooling fluid passes from the circuit assembly.

In an alternative arrangement, the interiors of the hollow structures together comprise a chamber to receive cooling fluid, and the regions within the container surrounding the hollow structures comprise a discharge duct by which the cooling fluid passes from the circuit assembly.

It is required that there is a difference in the pressure of the cooling fluid between when it is supplied to the chamber, and when it passes from the circuit assembly.

The chamber to receive the cooling fluid may be a plenum chamber to receive cooling fluid at a pressure greater than the pressure of the ambient surrounding the circuit assembly, the cooling fluid being supplied to the plenum chamber by means associated with the circuit assembly. Thus, the arrangement may be such that the cooling fluid may be discharged directly from the circuit assembly to the ambient, especially if the cooling fluid is air, and the ambient is air.

Whether the cooling fluid is supplied to the chamber under pressure, or not, and when the cooling fluid is not to be discharged directly to the ambient, discharge means for the cooling fluid may be provided within the circuit assembly, for example, vacuum discharge means.

The provision of the spaced apart hollow structures within the container, with the constituent modules and/or components of the circuit assembly mounted on substrates comprising at least parts of walls of the structures, ensures that the flow of cooling fluid within the circuit assembly, conveniently, and efficiently, can be directed to remove heat generated within the circuit assembly, if the holes through the structure walls are appropriately located in this respect. Further, a flexible arrangement in respect of the flow of cooling fluid through the circuit assembly is possible, the required distribution of the flow of cooling fluid being determined when the circuit assembly is being designed and/or during development stages for the construction of the circuit assembly, the optimum locations of the holes through the structure walls being determined, and the required number of holes easily being provided. Thermometers may be included in the circuit assembly, at least, during the development stages; and predetermined ambient conditions easily may be provided.

At least some of the constituent hollow structures of the circuit assembly each may include two, or more, substrates of the sub-assembly units. When a structure includes two substrates, the substrates may comprise at least parts of opposing walls of the structure. The opposing walls of the structure provided at least partially by the substrates may be parallel to each other, and/or may be major walls of the structure.

At least some of the constituent hollow structures each may comprise two at least substantially tray-shaped members, the two tray-shaped members being secured together to form the structure, with the planar portions of the members being both parallel to each other, and opposing each other, at least a part of one such planar portion comprising a substrate of the sub-assembly unit.

Alternatively, at least some of the constituent hollow structures of the circuit assembly each may include a frame-shaped member in which one or two substrates are mounted. If two substantially identical substrates are mounted in such a frame-shaped member, the substrates comprise at least parts of opposing walls of the structure, the member holding the substrates spaced apart.

The planar substrates of the sub-assembly units may be substantially identical in shape. Conveniently, in such an arrangement, the circuit assembly has a construction in which the planar substrates of the sub-assembly units extend both opposite to, and parallel to, each other, to form a regular arrangement of the planar substrates having a cross-sectional shape substantially identical to a major surface of a substrate.

An electrical interconnection member, such as a mother printed circuit board, may be provided to complete the required circuit, and possibly, at least partially, serves to secure the substrates within the circuit assembly, communication with the interior of the hollow structures possibly being provided via apertures through the electrical interconnection member, and the constituent substrates of such a circuit assembly possibly extend at least substantially transversely to the electrical interconnection member. Such an arrangement is convenient when a regular arrangement of substrates, as referred to in the preceding paragraph, is provided.

The means for mounting the hollow structures within the container may complete the container closure.

In any arrangement, the hollow structures each may be provided with external flanges arranged both to co-operate with each other, and possibly to co-operate with flanges provided on the container, the flanges on the structures and on the container, if provided, comprising, at least partially, the means for mounting the hollow structures within the container. Thus, possibly, the hollow structures and the co-operating flanges together comprise the container closure.

Conveniently, each structure, initially, has a plurality of spaced, readily removable portions at least some of the portions being removed to provide the holes for the flow of cooling fluid between the regions within the container surrounding the structures and the interior of the structure. The construction of the circuit assembly may be such that cooling fluid is to flow through at least some of the holes through the walls of the hollow structures in the form of jets, to impinge upon points of the circuit assembly from which heat is to be removed. Further, the construction of the circuit assembly may be such that, for at least some of the holes through the walls of the hollow structures, the cooling fluid is to be cooled significantly adiabatically at the holes.

Alternatively, or in addition, the construction of the circuit assembly may be such that cooling fluid is to flow slowly through at least some of the holes through the walls of the hollow structures.

Hence, it is possible that holes of different cross-sectional areas are provided within the circuit assembly.

At least some of the modules and/or components of the circuit assembly may be provided within the hollow structures.

Modules and/or components may be mounted on both major surfaces of at least some of the planar substrates of the circuit assembly.

When at least some of the holes for the flow of cooling fluid between the regions within the container surrounding the structures and the interior of the structures are provided through the substrates of the sub-assembly units, modules, and/or components, may be spaced from, but span, at least some of such holes. When modules and/or components are mounted on both major surfaces of at least some of the planar substrates of the circuit assembly, at least some of the modules and/or components may be provided one on either side of at least some of the holes through the walls of the hollow structures, and are spaced from, but span these holes; and/or at least some of the modules and/or components are in staggered relationship on the two major surfaces of a substrate, such modules and/or components individually are adjacent to different holes through the substrate, and are spaced from, but span these holes.

At least some of the planar substrates each may comprise the substrate of electrical insulating material of a printed circuit board.

In addition, or alternatively, at least some of the planar substrates each comprises a heat sink.

Otherwise printed circuit boards and/or heat sinks need not be provided in the circuit assembly.

Figure 2:
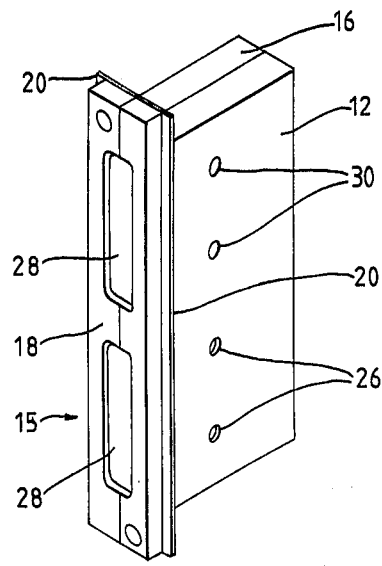
Figure 3:
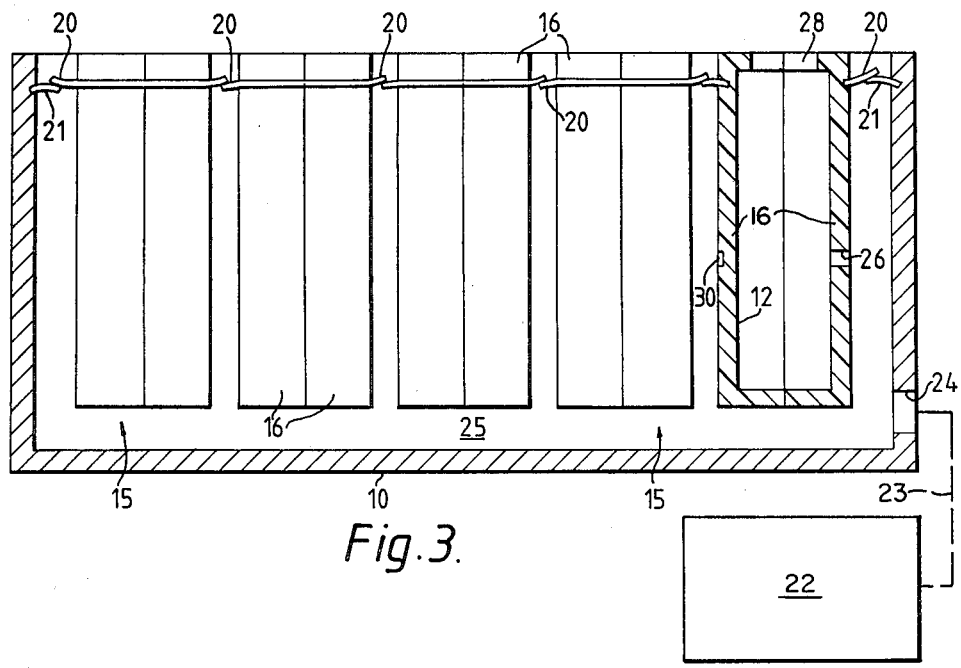

The present invention will now be described by way of example with reference to the accompanying drawings, in which FIG. 1 is a sectional plan view of one embodiment of a circuit assembly according to the present invention, the circuit assembly having a plurality of sub-assembly units electrically connected together, or to be connected together, to complete a required circuit, FIG. 2 is a perspective view of a hollow structure including two of the sub-assembly units of the circuit assembly of FIG. 1, FIG. 3 is a sectional side elevation of the circuit assembly, on the line III—III of FIG. 1, FIG. 4 is a section of part of a modified form of circuit assembly, and FIG. 5 is a section of part of another modified circuit assembly, including an electrical interconnection member.

The illustrated circuit assembly comprises a container 10, and a plurality of sub-assembly units 12, electrically connected together, or to be connected together, to complete a required circuit. Within the sub-assembly units 12 are a plurality of constituent modules and/or components 13 of the circuit assembly, the modules and/or components 13 being indicated only generally in dotted line form. The modules and/or the components 13 may have any convenient construction, for example, the modules comprising thin film modules, and the components comprising semiconductor components, and the modules and/or components having any number of leads extending therefrom. Each sub-assembly unit 12 includes a planar substrate 14 on which the modules and/or components are mounted.

The circuit assembly also includes a plurality of hollow structures, 15, each hollow structure 15 having two sub-assmelby units 12, and so includes two rectangular-shaped in plan planar substrates 14. Each sub-assembly unit 12 of the circuit assembly is provided by a generally tray-shaped member 16, having side portions 17 surrounding the planar substrate 14. Possible constructions for the tray-shaped member 16 are described in detail below with reference to FIGS. 4 and 5. Such members 16 are indicated in only a general way in FIGS. 1 to 3. Co-operating pairs of the tray-shaped members 16 fit together to form the substantially enclosed hollow structures 15, so that the pair of substrates 14 of each hollow structure are spaced apart and are parallel to each other. Hence, each substrate comprises a wall of a hollow structure 15. The tray-shaped members 16 are of electrical insulating material.

The modules and/or components 13 of each sub-assembly unit are secured to only one major surface of each substrate 14, there being patterns of conductors (not shown) also provided on the major substrate surfaces bearing the modules and/or components, to interconnect the modules and/or components mounted thereon. Thus, the substrates and the conductors closely resemble printed circuit boards.

The modules and/or components are only provided within the hollow structures 15.

The illustrated sub-assembly units 12, and hollow structures 15, are identical.

The hollow structures 15 are mounted spaced apart from each other within the container, one wall 18 of each structure, shown in FIG. 2, and not comprising a substrate 14, serving to provide part of a closure for the container 10. Flanges 20 (shown in FIGS. 2 and 3), extend around the wall 18 of each structure 15, and flanges 21 extend around the inside of the container wall, the flanges 20 and 21 co-operating with each other to complete the closure for the container 10, and to mount the structures within the container. The hollow structures 15, and the co-operating flanges 20 thereon, together comprise the container closure. The arrangement is such that the regions within the container surrounding the structures communicate directly with each other; but the interiors of the hollow structures are not in direct communication with each other.

The substrates 14 of the circuit assembly each have the same size and shape, and are mounted within the circuit assembly to extend opposite to, and parallel to, each other, and comprise a regular arrangement of substrates having a cross-sectional shape substantially identical to a major surface of a substrate.

In particular, the hollow structures 15 including the substrates 14 are spaced apart, but extend opposite to, and parallel to, each other, to comprise a regular arrangement within the circuit assembly.

Terminals for the sub-assembly units 12 may be provided in any convenient manner; and the sub-assembly units 12 may be interconnected to complete the required circuit in any convenient way. In one such arrangement, as illustrated, in connection with the modified circuit assembly of FIG. 5, an electrical interconnection member, such as a mother printed circuit board, is provided, and co-operates with terminals provided at one edge of each constituent substrate.

In a complex circuit assembly, such as that illustrated, and having densely packed modules and/or components, generated heat, which can cause damage, is required to be removed. Thus, a supply (not shown), of a cooling fluid, such as air, is connected to the container 10 through pipe 23 from source 22, and is in communication with the regions within the container surrounding the hollow structures, via a passage 24 through the container wall. The cooling fluid is supplied under a pressure, greater than the pressure of the ambient surrounding the circuit assembly, and so the regions within the container surrounding the hollow structures 15 comprise a plenum chamber 25.

Holes 26 are provided through the walls of the hollow structures 15 within the container, for the flow of cooling fluid between the chamber 25 and the interior of the structures 15. Two passages 28 (shown only in FIGS. 2 and 3), for the cooling fluid are provided through the container-enclosing wall 18 of each hollow structure, to communicate with the interior of the structure, and the hollow structures comprise discharge ducts by which the cooling fluid passes from the circuit assembly, direct to the ambient. Usually at least one hole 26 is provided through each hollow structure, for the flow of cooling fluid between the chamber 25 and the interior of the structure.

Each hollow structure 15 initially, has four spaced, readily removable portions 30 provided in each substrate 14, and at least some of these portions 30 are removed to provide the holes 26 for the flow of cooling fluid between the chamber 25 and the interior of the structure. The holes 26 are completed by piercing or punching out the readily removable portions 30.

The construction of the circuit assembly is such that cooling fluid flows through the holes 26 in the form of jets, to impinge upon points of the circuit assembly from which heat is to be removed. Further, the cooling fluid is cooled significantly adiabatically at the holes 26.

The modules and/or components 13 are spaced from, but span, at least some of the holes 26 through the substrates 14.

It is not essential that the substrates 14 have conductors thereon, and resemble printed circuit boards. The substrates, for example, may be solely of electrical insulating material, or comprise heat sinks.

The provision in a container of the spaced apart hollow structures, with the constituent modules and/or components of the circuit assembly mounted on substrates comprising walls of the structures, ensures that the flow of cooling fluid within the circuit assembly, conveniently, and efficiently, can be directed to remove heat generated within the circuit assembly, if the holes through the structure walls are appropriately located in this respect. Further, a flexible arrangement in respect of the flow of cooling fluid through the circuit assembly is possible, the required distribution of the flow of cooling fluid being determined when the circuit assembly is being designed and/or during development stages for the construction of the circuit assembly, the optimum locations of the holes through the structure walls being determined, and the required number of holes easily being provided. Thermometers may be included in the circuit assembly, at least, during the development stages; and predetermined ambient conditions easily can be provided.

Further, the circuit assembly is advantageous in that it is easy to assembly; and has a robust construction.

The construction of the circuit assembly may be such that heat sinks; and/or printed circuit boards are not included therein, which may be advantageous.

The construction of a circuit assembly according to the present invention is also advantageous in that it is easy to remove a hollow structure, and/or a sub-assembly unit, with a faulty component or module; and it is possible to have a standard construction, or standard constructions, for each sub-assembly unit, within a particular circuit assembly, or within any one of a plurality of different possible circuit assemblies, perhaps each sub-assembly unit varying from each other only in the form of, and/or the number of, constituent modules and/or components, where appropriate.

The construction of a circuit assembly according to the present invention may be modified in various different ways.

It is not essential that the regions within the container surrounding the hollow structures are in direct communication with each other.

The interiors of the hollow structures together may comprise a chamber to receive cooling fluid, and the regions within the container surrounding the hollow structures comprise a discharge duct by which the cooling fluid passes from the circuit assembly.

The interiors of the hollow structures may be in communication with each other.

Whilst it is required that there is a difference in the pressure of the cooling fluid between when it is supplied to the chamber, and when it passes from the circuit assembly, for example the cooling fluid may be supplied to a chamber, not comprising a plenum chamber, of the circuit assembly, at substantially ambient pressure, and vacuum discharge means may be provided for the cooling fluid. Discharge means, possibly comprising vacuum discharge means, may be provided irrespective of the supply pressure of the cooling fluid.

The constituent modules and/or components may be mounted in any convenient manner on the substrates. It is not essential that the modules and/or components are mounted to span holes through the substrates.

At least some of the modules and/or components may be provided on the outsides of the hollow structure.

Modules and/or components may be mounted on both major surfaces of at least some of the planar substrates of the circuit assembly, and at least some of the modules and/or components may be provided one on either side of at least some of the holes, and/or at least some of the modules and/or components are in staggered relationship on the two surfaces of a substrate, such modules and/or components individually being adjacent to different holes through the substrate.

Holes may be provided through parts of the walls of the hollow structures not comprising substrates for the constituent modules and/or components.

It is not essential that some substrates each carry a module or component, but each comprises a blank of a hollow structure. Only one module and/or component bearing substrate may be provided within at least some hollow structures.

Alternatively, more than two, possibly module and/or component bearing, substrates may be provided within at least some hollow structures.

When two, possibly module and/or component bearing, substrates are provided within a hollow structure, it is not essential that the substrates are parallel to, or are opposite to each other.

However, when they are parallel and opposite to each other they may be mounted in a frame shaped member 40 of the hollow structure 15' shown in FIG. 4. Re-entrant parts 41, of both major surfaces defined by the frame shaped member 40, provided shoulders 42, against which abut substrates 14' of sub-assembly units 12', the substrates 14' instead of being of electrically insulating material, comprise heat sinks, the substrates 14' being flush with the frame-shaped member 40. The substrates 14' are secured to the frame shaped member of screws 43.

Thus, the substrates 14' of the sub-assembly units 12' comprise only parts of the walls of the hollow structures 15'.

It is advantageous if the cooling fluid is turbulent after passage through the holes, in order to remove generated heat efficiently. It is not necessary for the cooling fluid to impinge on the constituent modules and/or components of the circuit assembly, but it may impinge on any convenient points in the circuit assembly from which generated heat is required to be removed. It is not essential that adiabatic expansion of the cooling fluid occurs at at least some of the holes. Further, it is not essential that jets of the cooling fluid issue from at least some of the holes. Thus, a mass of the cooling fluid may flow slowly through at least some of the holes. In particular, it may be convenient to provide holes 26 and 26' of different cross-sectional areas within the circuit assembly, as also is shown in FIG. 4.

If any constituent module or component of the circuit assembly does not dissipate a significant amount of heat, it may be that cooling fluid is not arranged to flow passed such a module or component. In particular, it may not be required for the cooling fluid to flow through at least some hollow structures of the circuit assembly, holes for the flow of the cooling fluid not being provided through the walls of such hollow structures, and possibly passages not being provided through the container-enclosing walls of such structures.

The hollow structures may be mounted within the container in any convenient way.

The closure for the container may be completed in any convenient manner. The constituent sub-assembly units may be mounted in the hollow structures in any convenient way.

Whilst terminals for the sub-assembly units may be provided in any convenient manner, in the part of the modified form of circuit assembly shown in FIG. 5, there is illustrated a construction for the hollow structures 15" of the circuit assembly similar to that of FIGS. 1 to 3, but incorporating terminals 50 for the sub-assembly units 12". Component leads 52 co-operate with sockets 53 embedded within side portions 17' of the tray-shaped members 16', the members 16' also providing substrates 14". Integral with the sockets 53 are plug shaped terminals parts 54 extending within bores 55 in the member portions 17'. An electrical interconnection member 60, comprising a printed circuit board, extends transversely to the regular arrangement of substrates 14", and has terminals comprising sockets 61, co-operating with the plug shaped terminal parts 54 of the hollow structures 15". The sockets 61 extend through bores 62 in the electrical insulating substrate 63 of the printed circuit board 60; and are connected to a pattern of conductors on the substrate 63, and indicated generally at 64.

An electrical interconnection member, at least partially, may serve to secure the substrates within the circuit assembly. It may be convenient to provide apertures in an electrical interconnection member for the flow of the cooling fluid therethrough.

It is not essential that the constituent sub-assembly units, or the hollow structures, of the circuit assembly, are identical with each other. In particular, it is not essential that the constituent planar substrates of the circuit assembly are identical in size, or composition, nor that the constituent hollow structures of the circuit assembly are identical in size.

The coolant supplied to the circuit assembly may be of any suitable fluid, instead of air.

What we claim is:

1. A circuit assembly having a plurality of subassembly units, each subassembly unit having a planar substrate, with constituent components of the circuit assembly being mounted on the substrates, the plurality of subassembly units being connected together to complete the required circuit, the circuit assembly also having a plurality of identical, substantially enclosed, hollow structures, the substrate of each subassembly unit considered individually comprising at least part of a wall of a substantially enclosed hollow structure, at least one substrate being included in each such structure, the constituent plurality of structures being mounted spaced apart from each other within an at least substantially enclosed container, one other wall of each structure providing part of a closure wall for the container, the container closure wall defining passages communicating with the interiors of the structures, the other container walls defining at least one further passage communicating with the regions within the container surrounding the structures, the walls of the structures within the container defining holes communicating with both the interiors of the structures and the regions within the container surrounding the structures, and there being provided a supply of cooling fluid connected to at least one passage defined by a container wall, there being a flow of cooling fluid through the container, between the interiors of the hollow structures and the regions within the container surrounding the structures, the arrangement being such that the holes defined by the walls of the hollow structures within the container cause the cooling fluid to flow directly over said components of the circuit assembly which are spaced from the holes and which generate heat, each of the hollow structures having a plurality of spaced, readily removable portions providing the holes when removed for the flow of cooling fluid between the regions within the container surrounding the hollow structures, and within each hollow structure.

2. A circuit assembly as claimed in claim 1 with the regions within the container surrounding the hollow structures receiving cooling fluid, and with the hollow structures comprising discharge ducts by which the cooling fluid passes from the circuit assembly.

3. A circuit assembly as claimed in claim 1 with the interiors of the hollow structures receiving cooling fluid, and with the regions within the container surrounding the hollow structures comprising a discharge duct by which the cooling fluid passes from the circuit assembly.

4. A circuit assembly as claimed in claim 1 in which at least some of the constituent hollow structures each comprise two at least substantially tray-shaped members secured together to form the structure, with the planar portions of the tray-shaped members being both parallel to each other, and opposing each other, at least a part of one such planar portion comprising a substrate of the sub-assembly unit.

5. A circuit assembly as claimed in claim 1 in which a substrate comprises at least parts of two major opposing and parallel walls of at least some of the hollow structures.

6. A circuit assembly as claimed in claim 5 having at least some of the constituent hollow structures of the circuit assembly each including a frame-shaped member in which two substrates are mounted.

7. A circuit assembly as claimed in claim 1 in which the planar substrates of the sub-assembly units are substantially identical in shape.

8. A circuit assembly as claimed in claim 1 in which an electrical interconnection member is provided to complete the required circuit.

9. A circuit assembly as claimed in claim 1 including means for flowing the cooling fluid through at least some of the holes defined by the walls of the hollow structures within the container in the form of jets, to impinge upon parts of the circuit assembly where heat is generated.

10. A circuit assembly as claimed in claim 1 including means for flowing the cooling fluid slowly through at least some of the holes defined by the walls of the hollow structures within the container.

11. A circuit assembly as claimed in claim 1 in which holes of different cross-sectional areas are defined by the walls of the hollow structures within the container.

12. A circuit assembly as claimed in claim 1 in which at least some of the components of the circuit assembly are provided within the hollow structures.

13. A circuit assembly as claimed in claim 1 in which at least some of the holes for the flow of cooling fluid between the regions within the container surrounding the structures and the interior of the structures are defined by substrates if the sub-assembly units, and components are spaced from, but span, at least some of such holes.

14. A circuit assembly as claimed in claim 1 in which at least some of the planar substrates each comprises a heat sink.

15. A circuit assembly as claimed in claim 1 the cooling fluid being air.

* * * * *